(12) United States Patent
Yoshikawa et al.

(10) Patent No.: US 8,710,600 B2
(45) Date of Patent: Apr. 29, 2014

(54) SEMICONDUCTOR PRESSURE SENSOR (75) Inventors: Eiji Yoshikawa, Chiyoda-ku (JP);
Shinichi Izuo, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 221 days.

(21) Appl. No.: 12/949,459

(22) Filed: Nov. 18, 2010

(65) Prior Publication Data

US 2011/0278685 A1 Nov. 17, 2011

(30) Foreign Application Priority Data

May 13, 2010 (JP) ................................. 2010-110921

(51) Int. Cl.
*H01L 29/84* (2006.01)

(52) U.S. Cl.
USPC ............................. 257/417; 257/418; 257/419

(58) Field of Classification Search
USPC .................................................. 257/417–419
See application file for complete search history.

(56) References Cited

U.S. PATENT DOCUMENTS

| 6,547,973 | B2 * | 4/2003 | Field ................................. 216/2 |
| 7,569,413 | B2 * | 8/2009 | Kasai et al. ...................... 438/53 |
| 8,188,556 | B2 * | 5/2012 | Adachi et al. .................. 257/415 |
| 2005/0199973 | A1 * | 9/2005 | Benzel et al. .................. 257/417 |
| 2010/0058865 | A1 * | 3/2010 | Zhang et al. ............... 73/514.38 |

FOREIGN PATENT DOCUMENTS

| CN | 1657401 A | 8/2005 |
| DE | 699 19 235 T2 | 9/2005 |
| EP | 0 928 959 B1 | 8/2004 |
| EP | 1 826 174 A2 | 8/2007 |
| EP | 2 226 620 A2 | 9/2010 |
| JP | 5-248973 A | 9/1993 |
| JP | 5-283712 A | 10/1993 |
| JP | 8-236788 A | 9/1996 |
| JP | 10-073503 A | 3/1998 |
| JP | 11-135806 A | 5/1999 |
| JP | 4214567 B2 | 5/1999 |
| JP | 3087336 B2 | 7/2000 |
| JP | 2002-350259 A | 12/2002 |
| JP | 2007-033304 A | 2/2007 |
| JP | 2007-093242 A | 4/2007 |
| JP | 4 273 663 B2 | 6/2009 |
| WO | 2004/057291 A1 | 7/2004 |
| WO | 2010/027600 A2 | 3/2010 |

OTHER PUBLICATIONS

Japanese Office Action issued in Japanese Patent Application No. 2010-110921 dated Feb. 27, 2012.

(Continued)

*Primary Examiner* — Matthew W Such
*Assistant Examiner* — Robert Carpenter
(74) *Attorney, Agent, or Firm* — Sughrue Mion, PLLC (57) ABSTRACT

A semiconductor pressure sensor that can improve diaphragm breakage pressure tolerance is provided.
Included are: a first semiconductor substrate on which is formed a recess portion that has an opening on a first surface in a thickness direction; a second semiconductor substrate that is disposed so as to face the first surface of the first semiconductor substrate; and a first silicon oxide film that is interposed between the first semiconductor substrate and the second semiconductor substrate, and on which is formed a penetrating aperture that communicates between the recess portion and the second semiconductor substrate, and at least a portion of an edge portion of the penetrating aperture is positioned inside an opening edge portion of the recess portion when viewed from a side facing the penetrating aperture and the opening of the recess portion.

8 Claims, 9 Drawing Sheets

(56) References Cited

OTHER PUBLICATIONS

Japanese Office Action issued in Japanese Patent Application No. 2010-110921 dated Feb. 19, 2013.

Chinese Office Action issued in Chinese Application No. 201110008491.0 dated Apr. 2, 2013.

German Office Action, dated Jul. 8, 2013, issued in counterpart German Patent Application No. 10 2010 051 515.9.

* cited by examiner

Amount of projection X of first silicon oxide film
―――――――――――――――――――――――――――
Thickness T of first silicon oxide film

FIG. 22

SEMICONDUCTOR PRESSURE SENSOR

BACKGROUND OF THE INVENTION

1. Field of the Invention

The present invention relates to a semiconductor pressure sensor.

2. Description of the Related Art

Conventional pressure sensor semiconductor substrates are produced by the following procedure.

First, an oxide film that has a predetermined thickness is formed on one surface of a first semiconductor substrate that is constituted by a single-crystalline silicon substrate, and a penetrating aperture that has an aperture direction that is oriented in the thickness direction of the oxide film is formed by removing a portion of the oxide film. Next, a recess portion that has an inner peripheral surface that is flush with an inner peripheral surface of the penetrating aperture is formed on the first semiconductor substrate. Next, a second semiconductor substrate that is constituted by a single-crystalline silicon substrate is bonded to the first semiconductor substrate by means of an oxide film so as to cover the penetrating aperture that is exposed on the surface of the oxide film. A diaphragm is formed on a portion of the second semiconductor substrate that faces the recess portion by reducing thickness of the second semiconductor substrate, and finally a conventional pressure sensor semiconductor substrate is produced by forming a strain detecting element on a surface of the diaphragm (see Patent Literature 1, for example).

Patent Literature 1: Japanese Patent No. 4214567 (Specification)

In conventional pressure sensor semiconductor substrates, positions of opening edge portions of the recess portion that is formed on the first semiconductor substrate and positions of edge portions of the penetrating aperture that is formed on the oxide film are aligned. Now, residual stresses arise in the oxide film, but magnitudes of the stresses that result from the residual stresses that act on the oxide film are discontinuous at the edge portions of the penetrating aperture. When pressure is applied to the diaphragm from outside, and the diaphragm flexes, large stresses arise at the opening edge portions of the recess portion. If the positions of the opening edge portions of the recess portion and the positions of the edge portions of the penetrating aperture are aligned, as in conventional pressure sensor semiconductor substrates, stresses that are discontinuous at the boundary of the edge portions of the penetrating aperture are superimposed on the stresses that arise in the diaphragm as the diaphragm flexes. Breakage pressure tolerance of the diaphragm when pressure is applied to the diaphragm from outside is reduced significantly because of this.

SUMMARY OF THE INVENTION

The present invention aims to solve the above problems and an object of the present invention is to provide a semiconductor pressure sensor that can improve diaphragm breakage pressure tolerance.

In order to achieve the above object, according to one aspect of the present invention, there is provided a semiconductor pressure sensor including: a first semiconductor substrate on which is formed a recess portion that has an opening on a first surface in a thickness direction; a second semiconductor substrate that is disposed so as to face the first surface of the first semiconductor substrate; and a first insulating film that is interposed between the first semiconductor substrate and the second semiconductor substrate, and on which is formed a penetrating aperture that communicates between the recess portion and the second semiconductor substrate, the semiconductor pressure sensor being characterized in that at least a portion of an edge portion of the penetrating aperture is positioned inside an opening edge portion of the recess portion when viewed from a side facing the penetrating aperture and the opening of the recess portion.

According to a semiconductor pressure sensor according to the present invention, when viewed from a side facing a penetrating aperture that is formed on a first insulating film and an opening of a recess portion that is formed on a first semiconductor substrate, at least a portion of an edge portion of the penetrating aperture is positioned further inward than an opening edge portion of the recess portion. Because the opening edge portion of the recess portion and the edge portion of the penetrating aperture are thereby disposed so as to be separated, stresses that are discontinuous at a boundary of the edge portion of the penetrating aperture are no longer superimposed on stresses that arise in the second semiconductor substrate when the second semiconductor substrate flexes, enabling breakage pressure tolerance of the second semiconductor substrate when pressure is applied from outside to a portion of the second semiconductor substrate that faces the recess portion to be improved.

DETAILED DESCRIPTION OF THE PREFERRED EMBODIMENTS

Preferred embodiments of the present invention will now be explained with reference to the drawings.

Embodiment 1

Figure 1:
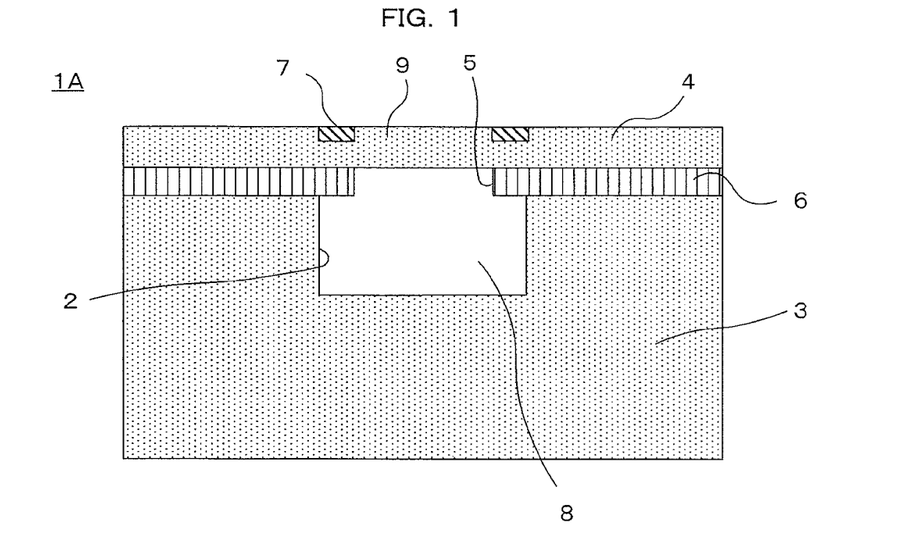
FIG. 1 is a cross section of a semiconductor pressure sensor according to Embodiment 1 of the present invention.

FIG. 1 is a cross section of a semiconductor pressure sensor according to Embodiment 1 of the present invention.

In FIG. 1, a semiconductor pressure sensor 1A includes: a first semiconductor substrate 3 on which is formed a recess portion 2 that has an opening on a first surface in a thickness direction; a second semiconductor substrate 4 that is disposed such that a first surface is oriented away from the recess portion 2, and a second surface is oriented toward the recess portion 2; a first silicon oxide film 6 that functions as a first insulating film that is interposed between the first semiconductor substrate 3 and the second semiconductor substrate 4, and on which is formed a penetrating aperture 5 that communicates between the recess portion 2 and the second semiconductor substrate 4; and strain detecting elements 7 that are disposed on the first surface side of the second semiconductor substrate 4.

Although not shown, the semiconductor pressure sensor 1A has wiring and electrodes for supplying power to the strain detecting elements 7, and for extracting electrical signals that are output from the strain detecting elements 7, etc., and a protective film for protecting these, etc.

A single-crystalline silicon substrate is used for the first semiconductor substrate 3 and the second semiconductor substrate 4, respectively, and a construction that includes a silicon oxide film between single-crystalline silicon substrates in this manner is generally called "silicon on insulator" (SOI).

The recess portion 2 is formed so as to have a depth direction that is oriented in a thickness direction of the first semiconductor substrate 3, and is prepared such that an external shape of a cross section that is perpendicular to the depth direction is square. A thickness direction of the first silicon oxide film 6 is oriented in the thickness direction of the first semiconductor substrate 3 and the second semiconductor substrate 4, and an aperture direction of the penetrating aperture 5 is oriented in the thickness direction of the first silicon oxide film 6.

When viewed from a side facing the opening of the penetrating aperture 5 and the recess portion 2, all parts of edge portions of the penetrating aperture 5 are positioned further inward than opening edge portions of the recess portion 2, and a distance between the opening edge portions of the penetrating aperture 5 and the recess portion 2 is a predetermined value. In other words, the first silicon oxide film 6 extends outward from the opening edge portions of the recess portion 2 by a predetermined length.

A reference pressure chamber 8 is formed by a space that is surrounded by wall surfaces that constitute the recess portion 2 and the penetrating aperture 5, and a wall surface of the second semiconductor substrate 4 that covers the opening of the penetrating aperture 5. A region of the second semiconductor substrate 4 that faces the recess portion 2 constitutes a diaphragm 9. In other words, a boundary between the diaphragm 9 and other regions inside the second semiconductor substrate 4 is defined by a frame of the second semiconductor substrate 4 that faces the opening edge portions of the recess portion 2. Moreover, portions of outer peripheral edge portions of the diaphragm 9 face the recess portion 2 so as to have the first silicon oxide film 6 interposed.

A plurality of strain detecting elements 7 are formed so as to be separated from each other on a first surface of the diaphragm 9 that faces away from the recess portion 2.

When pressure is applied to the diaphragm 9 from outside, the diaphragm 9 flexes, and mainly portions near the boundary of the diaphragm 9 are strained.

The strain detecting elements 7 have resistance elements in which resistance changes in response to the amount of strain on the diaphragm 9, and are configured so as to output electrical signals that correspond to the changes in resistance.

In other words, because the diaphragm 9 flexes in response to differential pressure between the reference pressure chamber 8 and external pressure, the semiconductor pressure sensor 1A detects a pressure that corresponds to the differential pressure between the pressure applied to the first surface of the diaphragm 9 (the surface on the opposite side from the recess portion 2) and the reference pressure chamber 8. Moreover, if the pressure inside the reference pressure chamber 8 is a vacuum, it becomes possible to measure the pressure that is applied to the diaphragm 9 as absolute pressure.

According to a semiconductor pressure sensor 1A that has been configured in the above manner, all parts of the edge portions of the penetrating aperture 5 are positioned further inward than the opening edge portions of the recess portion 2 when viewed from a side facing the opening of the penetrating aperture 5 and the recess portion 2. Now, residual stresses arise in the first silicon oxide film 6, and magnitude of the stresses that result from the residual stresses in the first silicon oxide film 6 changes discontinuously at the edge portions of the penetrating aperture 5. In the semiconductor pressure sensor 1A, because the opening edge portions of the recess portion 2 and the edge portions of the penetrating aperture 5 are disposed so as to be separated, stresses in the first silicon oxide film 6 that arise so as to be discontinuous at the boundary of the edge portions of the penetrating aperture 5 are no longer superimposed on stresses that arise in the diaphragm 9 when the diaphragm 9 flexes as a result of the difference between the pressure applied to the diaphragm 9 from outside and the pressure inside the reference pressure chamber 8. Because local concentrations of stress to the diaphragm 9 are thereby suppressed and breakage pressure tolerance of the diaphragm 9 is increased, the diaphragm 9 can be preemptively prevented from being damaged.

Next, a method for manufacturing the semiconductor pressure sensor 1A will be explained.

Figure 2:
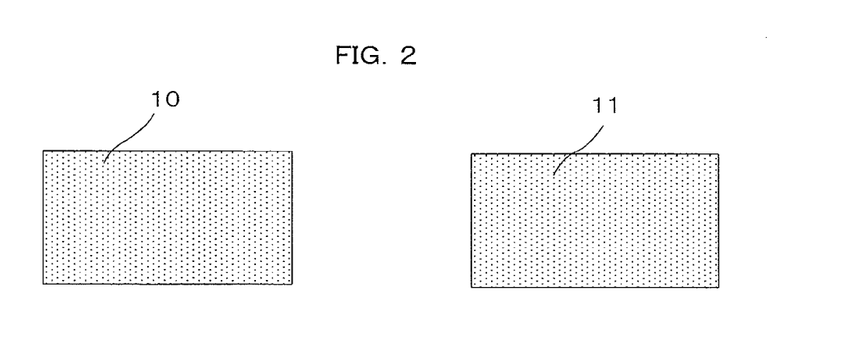
FIG. 2 is a diagram that explains a preparatory step in a method for manufacturing the semiconductor pressure sensor according to Embodiment 1 of the present invention.
Figure 3:
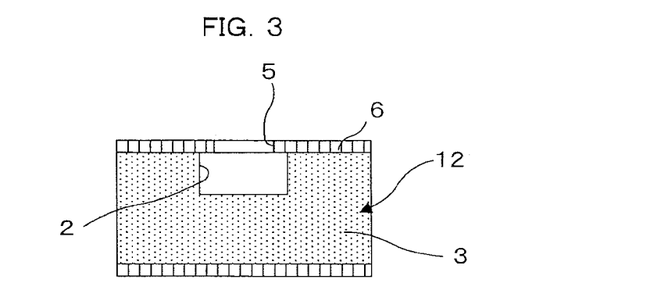
FIG. 3 is a diagram that explains an insulating film and recess portion forming step in the method for manufacturing the semiconductor pressure sensor according to Embodiment 1 of the present invention.
Figure 4:
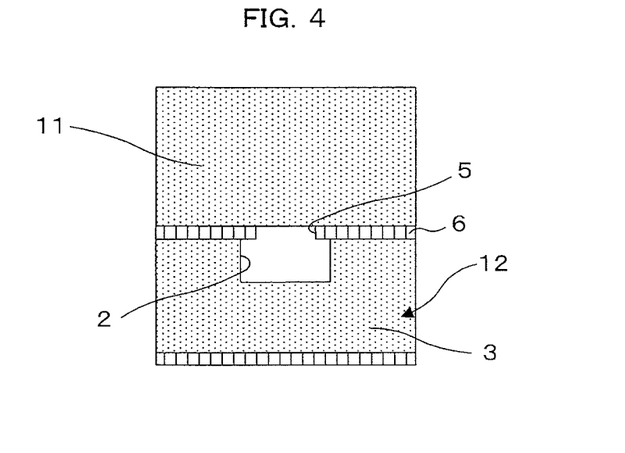
FIG. 4 is a diagram that explains a substrate linking step in the method for manufacturing the semiconductor pressure sensor according to Embodiment 1 of the present invention.
Figure 5:
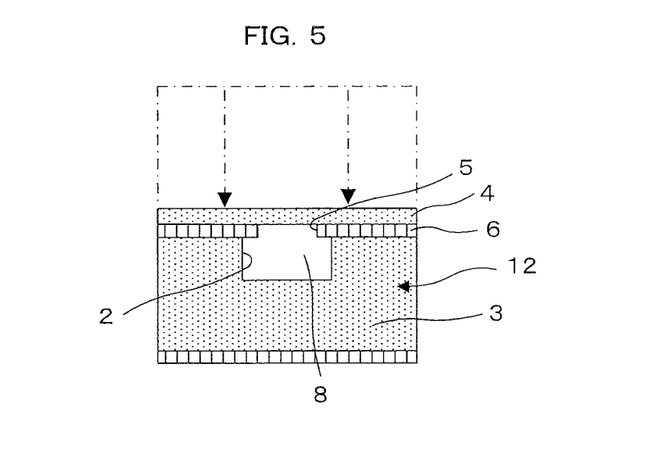
FIG. 5 is a diagram that explains a diaphragm forming step in the method for manufacturing the semiconductor pressure sensor according to Embodiment 1 of the present invention.
Figure 6:
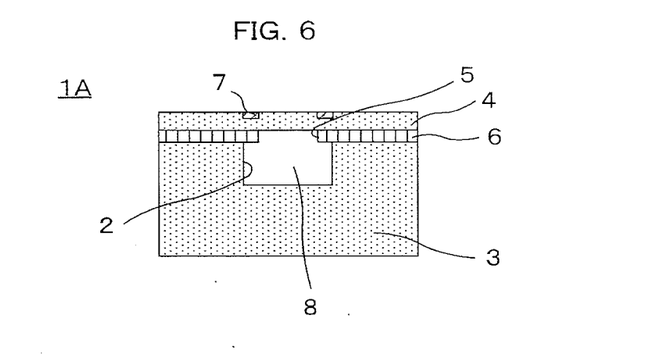
FIG. 6 is a diagram that explains a strain detecting element forming and aftertreatment step in the method for manufacturing the semiconductor pressure sensor according to Embodiment 1 of the present invention.

FIG. 2 is a diagram that explains a preparatory step in a method for manufacturing the semiconductor pressure sensor according to Embodiment 1 of the present invention, FIG. 3 is a diagram that explains an insulating film and recess portion forming step in the method for manufacturing the semiconductor pressure sensor according to Embodiment 1 of the present invention, FIG. 4 is a diagram that explains a substrate linking step in the method for manufacturing the semiconductor pressure sensor according to Embodiment 1 of the present invention, FIG. 5 is a diagram that explains a diaphragm forming step in the method for manufacturing the semiconductor pressure sensor according to Embodiment 1 of the present invention, and FIG. 6 is a diagram that explains a strain detecting element forming and aftertreatment step in the method for manufacturing the semiconductor pressure sensor according to Embodiment 1 of the present invention.

In a preparatory step, a first semiconductor base material substrate 10 and a second semiconductor base material substrate 11 are prepared, as shown in FIG. 2.

The first semiconductor base material substrate 10 and the second semiconductor base material substrate 11 are single-crystalline silicon substrates in which a plane direction is 100. The first semiconductor base material substrate 10 is not limited to a particular conductivity type and resistivity, but it is preferable for the first semiconductor base material substrate 10 to have p-type conductivity, and to have a resistivity of approximately 1 to 10 Ω·cm, for example. It is preferable for the second semiconductor base material substrate 11 to have n-type conductivity, and to have a resistivity of approximately 1 to 10 Ω·cm.

In an insulating film and recess portion forming step, a surface of the first semiconductor base material substrate 10 is oxidized by a thermal oxidation method, as shown in FIG. 3. Thus, the first semiconductor base material substrate 10 becomes a semiconductor and insulating film substrate 12 that is constituted by: the first semiconductor substrate 3; and a first silicon oxide film 6 that is configured on all parts of the surface of the first semiconductor substrate 3. It is preferable for thickness of the first silicon oxide film 6 to be greater than or equal to 0.1 μm, and more preferably 0.2 to 3.0 μm. By making the thickness of the first silicon oxide film 6 0.2 to 3.0 μm, moisture becomes less likely to be absorbed into the surface of the first silicon oxide film 6.

Next, a predetermined portion of the first silicon oxide film 6 on a first surface side of the first semiconductor substrate 3 in the thickness direction is removed using a photoengraving technique and a plasma etching technique to form a penetrating aperture 5 that has a square internal shape.

In addition, etching is applied to the first semiconductor substrate 3 through the penetrating aperture 5 to form a recess portion 2 that has an opening on the first surface of the first semiconductor substrate 3.

A "Bosch process" is adopted in the formation of the recess portion 2 that enables etching in the thickness direction of the first semiconductor substrate 3 to be performed by alternately introducing perfluorocyclobutane gas and sulfur hexafluoride gas into the region that is being subjected to etching. A side of the internal shape of the recess portion 2 can be made approximately 1 to 5 μm larger than a side of the penetrating aperture 5 of the first silicon oxide film 6 by adjusting the etching conditions of the first semiconductor substrate 3. Moreover, the present invention is not limited to adopting a Bosch process in the formation of the recess portion 2, and wet etching by an alkali solution such as potassium hydroxide, tetramethylammonium hydroxide, etc., may also be adopted.

In a substrate linking step, the semiconductor and insulating film substrate 12 and the second semiconductor base material substrate 11 are joined by a direct joining method that will be explained below such that the second semiconductor base material substrate 11 covers the penetrating aperture 5 and faces the first semiconductor substrate 3 so as to have the first silicon oxide film 6 interposed, as shown in FIG. 4.

In the linking operation between the semiconductor and insulating film substrate 12 and the second semiconductor base material substrate 11, a mixed solution in which sulfuric acid at a concentration of 98 percent and hydrogen peroxide solution at a concentration of 30 percent have been mixed together at a volume ratio of 4:1 and heated to 130 degrees Celsius is first prepared, and a rinsing treatment is applied to the semiconductor and insulating film substrate 12 using this mixed solution for approximately ten minutes and then washed using pure water. A surface of the semiconductor and insulating film substrate 12 is thereby made hydrophilic.

Next, at room temperature, the semiconductor and insulating film substrate 12 and the second semiconductor base material substrate 11 are temporarily fixed in close contact with each other such that the second semiconductor base material substrate 11 covers the penetrating aperture 5.

The temporary fixing between the semiconductor and insulating film substrate 12 and the second semiconductor base material substrate 11 may be performed under any pressure environment from atmospheric pressure through to a vacuum, but it is preferable for the temporary fixing to be performed in a vacuum if the reference pressure chamber 8 that is formed in subsequent steps is to be evacuated.

An annealing treatment is then performed on the semiconductor and insulating film substrate 12 and the second semiconductor base material substrate 11 that have been temporarily fixed to join together the semiconductor and insulating film substrate 12 and the second semiconductor base material substrate 11. Thus, the reference pressure chamber 8 is formed by a space that is surrounded by the wall surfaces of the recess portion 2 and the penetrating aperture 5 and the wall surface of the second semiconductor base material substrate 11 that covers the opening of the penetrating aperture 5.

In order to join the semiconductor and insulating film substrate 12 and the second semiconductor base material substrate 11 together firmly, it is preferable for the annealing treatment to be performed under conditions in a temperature range of 1,000 to 1,200 degrees Celsius, and it is preferable for treatment time to be greater than or equal to two hours, more desirably greater than or equal to six hours. In order to perform oxidation of the surface of the semiconductor and insulating film substrate 12 and the second semiconductor base material substrate 11, it is preferable for the annealing treatment to be performed in an environment to which oxygen and water vapor have been introduced. Moreover, depiction of the oxide film that is formed by the annealing treatment has been omitted.

In a diaphragm forming step, the second semiconductor base material substrate 11 is reduced to a predetermined thickness, as shown in FIG. 5, using techniques such as grinding, chemical machine polishing, etc. The second semiconductor substrate 4 is constituted by the second semiconductor base material substrate 11 that has been reduced in thickness. The diaphragm 9 is formed by the region of the second semiconductor substrate 4 that faces the opening of the recess portion 2.

Because grinding or polishing of the second semiconductor base material substrate 11 is performed in an environment under atmospheric pressure, if the reference pressure chamber 8 is a vacuum, there is a possibility that the portion of the second semiconductor base material substrate 11 on which the diaphragm 9 is being formed (hereinafter "diaphragm forming region") may flex as the thickness of the second semiconductor base material substrate 11 becomes thinner, and the thickness of the diaphragm 9 that is formed may be irregular.

The limit of reduction in thickness of the diaphragm 9 is determined by these irregularities in the thickness of the diaphragm 9 and the amount of flexure of the diaphragm 9. It is desirable for the irregularities in the thickness of the diaphragm 9 and the amount of flexure of the diaphragm 9 to be less than or equal to 1 μm. Although it also depends on the pressure range that the semiconductor pressure sensor 1A will measure, if the semiconductor pressure sensor 1A will be used to measure a range of pressures from zero to one atmosphere, for example, the irregularities in thickness and amount of flexure of the diaphragm 9 can be made less than or equal to 1 μm if the diaphragm 9 has an external shape that is a square that has 500 μm to a side, and a thickness of 20 μm.

In a strain detecting element forming and aftertreatment step, as shown in FIG. 6, strain detecting elements 7 are first formed at predetermined positions on the diaphragm 9 as will be explained below.

It is preferable for the strain detecting elements 7 to be formed on the second semiconductor substrate 4, for example, by injecting and diffusing a p-type impurity such as boron, etc., into the second semiconductor substrate 4 which is n-type.

Moreover, since the recess portion 2 cannot be seen using visible light, it is difficult to find the boundary of the diaphragm 9. Here, the boundary of the diaphragm 9 can be confirmed by shining white light that includes wavelengths that are greater than or equal to 1,000 nm on the first semiconductor substrate 3, the first silicon oxide film 6, and the second semiconductor substrate 4, and capturing images of transmitted light or reflected light using an infrared camera.

Strain detecting elements 7 can thereby be formed on a central portion of the diaphragm 9, and at precise positions of regions near outer peripheral edge portions of the diaphragm 9 at which the amount of strain is greatest when pressure that is applied to the diaphragm 9 from outside acts in a direction that flexes the diaphragm 9.

Although not shown, wiring and electrodes for supplying power to the strain detecting elements 7, and for extracting an electrical signal that is output from the strain detecting elements 7, etc., and a protective film for protecting these, etc., are formed, and then the integrated first semiconductor substrate 3, first silicon oxide film 6, and second semiconductor substrate 4 are diced into a predetermined shape. Finally, manufacturing of the semiconductor pressure sensor 1A is completed by removing the first silicon oxide film 6 on a second surface side of the first semiconductor substrate 3, if required.

Because effects that result from configuring the semiconductor pressure sensor 1A as described above were confirmed in tests, the contents thereof will be now be explained in detail.

Figure 7:
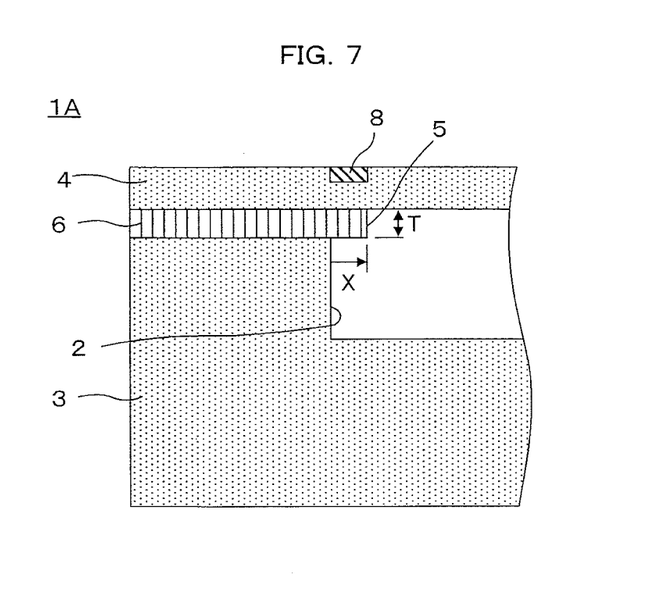
FIG. 7 is a partially-enlarged cross section of the semiconductor pressure sensor according to Embodiment 1 of the present invention.
Figure 8:
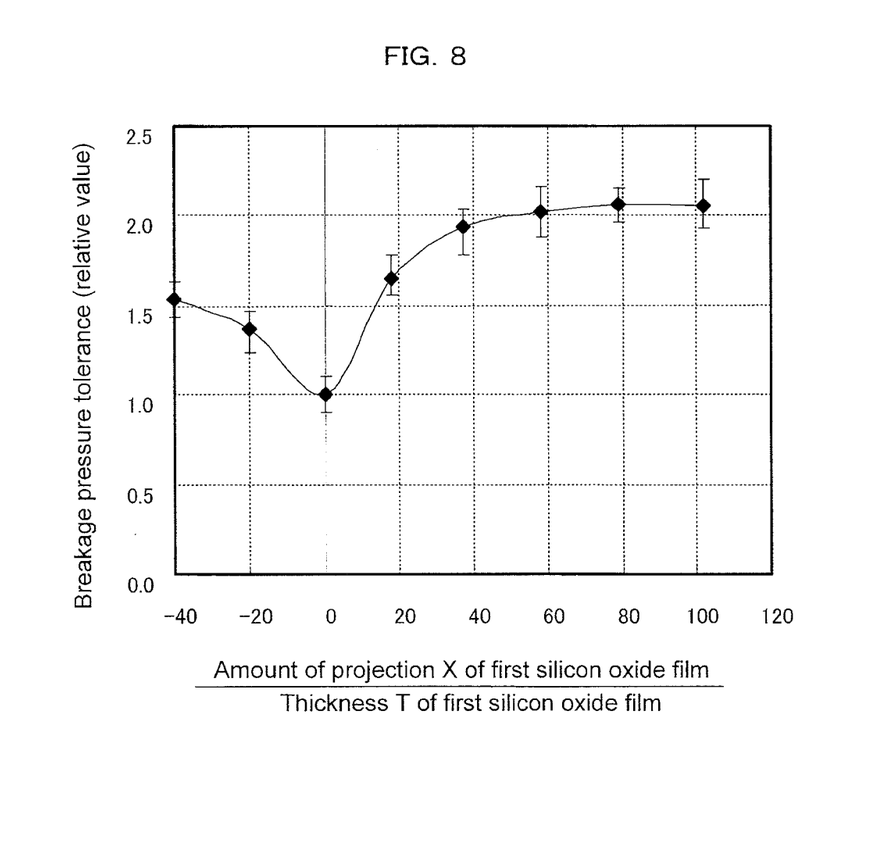
FIG. 8 is a graph showing a relationship between breakage pressure tolerance and (amount of projection of a first silicon oxide film)/(thickness of the first silicon oxide film) in the semiconductor pressure sensor according to Embodiment 1 of the present invention.

FIG. 7 is a partially-enlarged cross section of the semiconductor pressure sensor according to Embodiment 1 of the present invention, and FIG. 8 is a graph showing a relationship between breakage pressure tolerance and (amount of projection of a first silicon oxide film)/(thickness of the first silicon oxide film) in the semiconductor pressure sensor according to Embodiment 1 of the present invention.

As shown in FIG. 7, X is a distance from the opening edge portions of the recess portion 2 of the semiconductor pressure sensor 1A to the edge portions of the penetrating aperture 5 of the first silicon oxide film 6, in other words, an amount of projection of the first silicon oxide film 6 from the opening edge portions of the recess portion 2, and T is the thickness of the first silicon oxide film 6.

Although not shown, comparative semiconductor pressure sensors that will be explained below were prepared. Some comparative semiconductor pressure sensors in which edge portions of the penetrating aperture 5 were aligned with the opening edge portions of the recess portion 2 when viewed from a side facing the opening of the penetrating aperture 5 and the recess portion 2 were prepared, and some in which edge portions of the penetrating aperture 5 were positioned outside the opening edge portions of the recess portion 2.

To facilitate explanation, the distance from the opening edge portions of the recess portion 2 to the edge portions of the penetrating aperture 5 of the comparative semiconductor pressure sensors will be designated −X below.

The breakage pressure tolerance of the diaphragms 9 of the semiconductor pressure sensors 1A and the comparative semiconductor pressure sensors were measured using X/T as a parameter. Comparative semiconductor pressure sensors were prepared in which X/T was zero, and approximately −20 and −40, and semiconductor pressure sensors 1A were prepared in which X/T was approximately 20, 40, 60, 80, and 100.

Breakage pressure tolerance changes depending on size and thickness of the diaphragm 9 and thickness of the first silicon oxide film 6. Moreover, "size" of the diaphragm 9 means external size of a cross section that is perpendicular to the thickness direction of the diaphragm 9.

A plurality of semiconductor pressure sensors that had different conditions for the size and thickness of the diaphragm 9 and the thickness of the first silicon oxide film 6 were prepared for each value of X/T. Here, semiconductor pressure sensors were used in which the external side of the diaphragm 9 was within a range from 200 to 2,000 μm, the thickness of the diaphragm 9 was within a range from 5 to 50 μm, and the thickness T of the first silicon oxide film 6 was within a range from 0.1 to 5.0 μm.

Measured results of breakage pressure tolerance are shown in FIG. 8.

In FIG. 8, the values of breakage pressure tolerance that were measured in each of the semiconductor pressure sensors are shown as relative values that have been standardized against values of breakage pressure tolerance of the comparative semiconductor pressure sensor in which X/T was zero. Moreover, average values of the values of breakage pressure tolerance that were measured in the plurality of the semiconductor pressure sensor in which X/T had equal values are indicated by black diamonds "♦".

The breakage pressure tolerance of the comparative semiconductor pressure sensor in which X/T was zero was lowest, and the breakage pressure tolerance of both the semiconductor pressure sensors 1A and the comparative semiconductor pressure sensors increased continuously as the absolute value of X/T increased. The breakage pressure tolerance of the comparative semiconductor pressure sensor in which X/T was zero was approximately half the value of the maximum value of the breakage pressure tolerance of the diaphragm 9 of the semiconductor pressure sensor 1A.

The breakage pressure tolerance of the semiconductor pressure sensor 1A when the value of X/T was approximately 15 was 1.5 times the breakage pressure tolerance of the comparative semiconductor pressure sensor in which X/T was equal to zero, and doubled in the vicinity of X/T=50. When X/T exceeded 50, increases in breakage pressure tolerance of the semiconductor pressure sensor 1A that accompanied increases in X/T began to saturate.

The reason for the breakage pressure tolerance of the semiconductor pressure sensor 1A being greater than the breakage pressure tolerance of the comparative semiconductor pressure sensor in which X/T is zero, regardless of the value of X/T, can be considered to be because stresses in the first silicon oxide film 6 that arise so as to be discontinuous at the boundary of the edge portions of the penetrating aperture 5 are no longer superimposed on stresses that arise in the diaphragm 9 as the diaphragm 9 flexes due to pressure being applied from outside by the diaphragm 9. When X/T was greater than or equal to 50, approximately constant breakage pressure tolerance was measured regardless of the value of X/T, but this can be considered to be because a value of breakage pressure tolerance of the diaphragm 9 that is exhibited normally under conditions in which local concentrations of stress to the diaphragm 9 are avoided emerged in the measured results because local concentrations of stress on the diaphragm 9 were suppressed significantly.

The reason for the breakage pressure tolerance decreasing as X/T of the semiconductor pressure sensor 1A approaches zero is thought to be because stresses that are generated when pressure is applied to the diaphragm 9 from outside are most easily concentrated at portions near the boundary of the diaphragm 9 when the edge portions of the penetrating aperture 5 are aligned with the outer edge portions of the diaphragm 9 that face the opening edge portions of the recess portion 2.

In comparative semiconductor pressure sensors in which X/T was less than zero, on the other hand, the breakage pressure tolerance of the diaphragm 9 also increased compared to the comparative semiconductor pressure sensors in which X/T was zero.

However, if we assume that the external shape of the first semiconductor substrate 3 and the second semiconductor substrate 4 is constant, then the joining surface area of the first semiconductor substrate 3 and the second semiconductor substrate 4 through the first silicon oxide film 6 decreases as the absolute value of X/T becomes greater than zero. For this reason, making X/T less than zero is undesirable from viewpoints of securing joining strength between the first semiconductor substrate 3 and the second semiconductor substrate 4 through the first silicon oxide film 6, and of securing airtightness of the reference pressure chamber 8.

It is also undesirable when a constant joining surface area is to be ensured between the first semiconductor substrate 3 and the second semiconductor substrate 4, because the external size of the first semiconductor substrate 3 and the second semiconductor substrate 4 will be increased.

To summarize the above, by making X/T greater than zero, effects can be achieved such as enabling breakage pressure tolerance of the diaphragm 9 to be improved without reducing the joining surface area between the first semiconductor substrate 3 and the second semiconductor substrate 4. In a region in which X/T is greater than 50, increases in breakage pressure tolerance of the diaphragm 9 that accompany increases in X/T are saturated. If X/T is greater than 50, a long time is required for etching time in the insulating film and recess portion forming step, and it is difficult to form the first silicon oxide film 6 according to desired dimensions. Because of this, it is more preferable for X/T of the semiconductor pressure sensor 1A to be set to a range in which X/T is greater than zero and less than or equal to 50 (0<X/T≤50).

Moreover, in Embodiment 1, all parts of edge portions of the penetrating aperture 5 are explained as being positioned further inward than opening edge portions of the recess portion 2 when viewed from a side facing the opening of the penetrating aperture 5 and the recess portion 2, and a distance between the opening edge portions of the penetrating aperture 5 and the recess portion 2 as being a predetermined value, but improvements in breakage pressure tolerance of the diaphragm 9 can be achieved if at least a portion of the edge portions of the penetrating aperture 5 is positioned inside the opening edge portions of the recess portion 2.

The first semiconductor substrate 3 and the second semiconductor substrate 4 are explained as being single-crystalline silicon substrates, but the first semiconductor substrate 3 and the second semiconductor substrate 4 are not limited to single-crystalline silicon substrates, and silicon carbide substrates, etc., may also be used. The first insulating film is explained as being the first silicon oxide film 6, but is not limited to the first silicon oxide film 6, and silicon carbide insulating films, etc., may also be used.

The cross-sectional shape of the diaphragm 9 and the internal shape of the penetrating aperture 5 are explained as being square, but similar effects to those above can also be achieved using other shape such as circles, etc.

Embodiment 2

Figure 9:
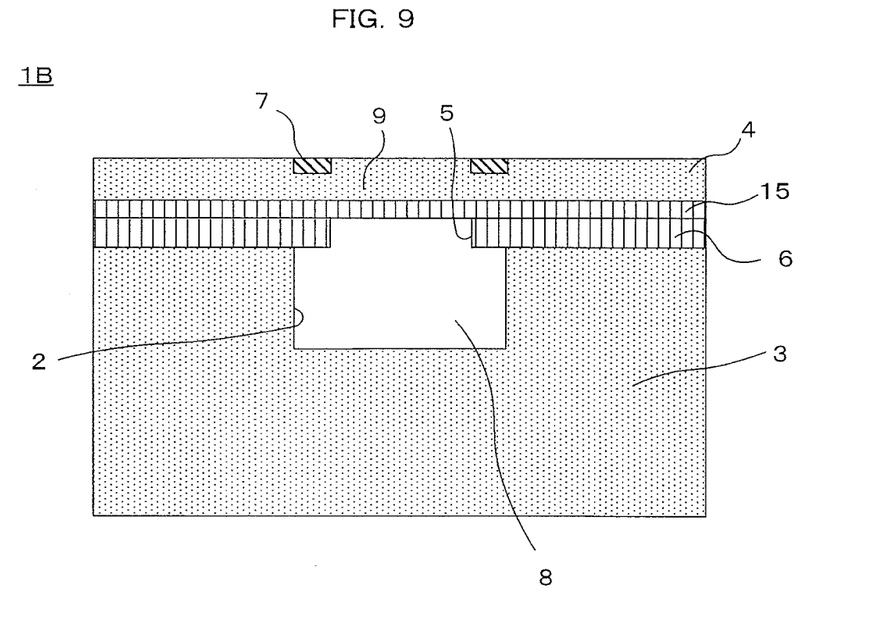
FIG. 9 is a cross section of a semiconductor pressure sensor according to Embodiment 2 of the present invention.

FIG. 9 is a cross section of a semiconductor pressure sensor according to Embodiment 2 of the present invention.

Moreover, in FIG. 9, portions identical to or corresponding to those in Embodiment 1 will be given identical numbering, and explanation thereof will be omitted.

In FIG. 9, in a semiconductor pressure sensor 1B, a second silicon oxide film 15 that functions as a second insulating film that covers a penetrating aperture 5 that is formed on a second semiconductor substrate 4 and a first silicon oxide film 6 is disposed on a surface on a recess portion side of the second semiconductor substrate 4. In other words, the second silicon oxide film 15 is disposed on a surface of the second semiconductor substrate 4 near the first silicon oxide film 6 so as to be disposed between a diaphragm 9 and a recess portion 2.

The rest of the configuration of the semiconductor pressure sensor 1B is similar to that of the semiconductor pressure sensor 1A.

A method for manufacturing the semiconductor pressure sensor 1B will now be explained.

The method for manufacturing the semiconductor pressure sensor 1B is similar to the method for manufacturing the semiconductor pressure sensor 1A except that a second semiconductor base material substrate oxidizing step is implemented before implementing the substrate linking step.

The second semiconductor base material substrate oxidizing step performs an oxidizing treatment on the second semiconductor base material substrate 11 such that the second silicon oxide film 15 is formed on all parts of the surface of the second semiconductor base material substrate 11.

Hereinafter, to facilitate explanation, the second semiconductor base material substrate 11 on which the oxidizing treatment has been performed will be described as the second semiconductor base material substrate 11.

In a substrate linking step, the second semiconductor base material substrate 11 on which the second silicon oxide film 15 has been formed is disposed such that a first surface side of the second semiconductor base material substrate 11 is oriented away from the first silicon oxide film 6, and a second surface of the second semiconductor base material substrate 11 is disposed on the first silicon oxide film 6 side. The second silicon oxide film 15 is thereby disposed so as to cover the penetrating aperture 5 of the first silicon oxide film 6.

Thereafter, the semiconductor pressure sensor 1B can be manufactured by a procedure that is similar to that of the method for manufacturing the semiconductor pressure sensor 1A.

According to Embodiment 2, a second silicon oxide film 15 is disposed on a surface of a second semiconductor substrate 4 near a first semiconductor substrate 3 so as to be disposed between a diaphragm 9 and a recess portion 2. Residual stresses also arise in the second silicon oxide film 15 in a similar manner to those in the first silicon oxide film 6, and since the first silicon oxide film 6 and the second silicon oxide film 15 are disposed to contact each other, discontinuities at the edge portions of the penetrating aperture 5 of stresses that result from residual stresses in the first silicon oxide film 6 are reduced significantly. Since discontinuities in the stresses at the edge portions of the penetrating aperture 5 are reduced significantly, stresses that arise in the diaphragm 9 as the diaphragm 9 flexes due to the difference between the pressure applied to the diaphragm 9 from outside and the pressure inside the reference pressure chamber 8 can be suppressed to only those that result from the flexing of the diaphragm 9. The breakage pressure tolerance of the diaphragm 9 can thereby be improved further.

Moreover, in Embodiment 2, the second insulating film is explained as being the second silicon oxide film 15, but is not limited to the second silicon oxide film 15, and silicon carbide insulating films, etc., may also be used.

Embodiment 3

Figure 10:
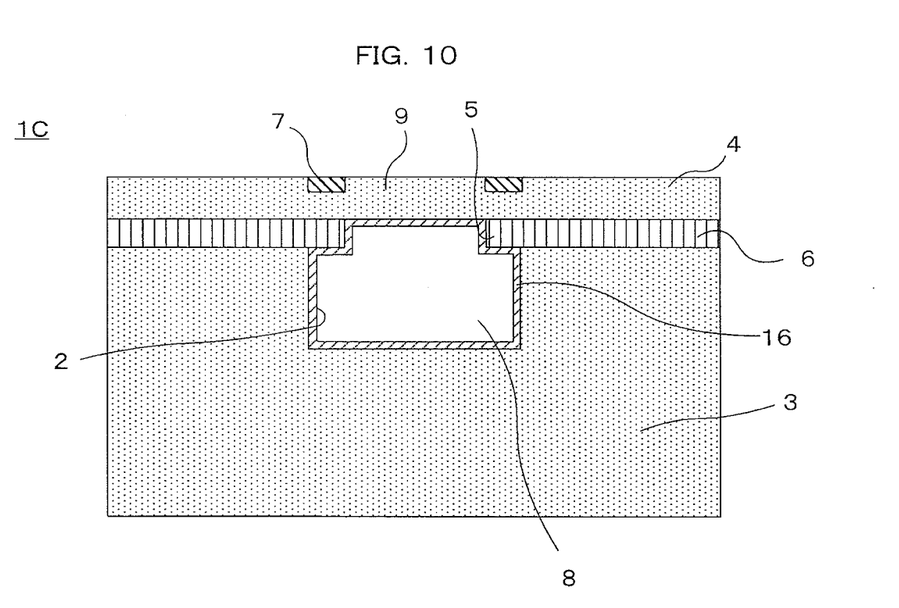
FIG. 10 is a cross section of a semiconductor pressure sensor according to Embodiment 3 of the present invention.

FIG. 10 is a cross section of a semiconductor pressure sensor according to Embodiment 3 of the present invention.

Moreover, in FIG. 10, portions identical to or corresponding to those in Embodiment 1 will be given identical numbering, and explanation thereof will be omitted.

In FIG. 10, in a semiconductor pressure sensor 1C, a third silicon oxide film 16 that functions as a third insulating film is formed on all parts of surfaces of a reference pressure chamber 8, in other words, wall surfaces that constitute a recess portion 2 and a penetrating aperture 5, and a wall surface of a second semiconductor substrate 4 that covers an opening of the penetrating aperture 5.

The rest of the configuration of the semiconductor pressure sensor 1C is similar to that of the semiconductor pressure sensor 1A.

According to a semiconductor pressure sensor 1C that has been configured in the above manner, the third silicon oxide film 16 is formed on all parts of the wall surfaces that constitute the recess portion 2 and the penetrating aperture 5, and the wall surface of the second semiconductor substrate 4 that covers the opening of the penetrating aperture 5. By forming the third silicon oxide film 16 into a surface layer on the recess portion 2, the region in which stresses are concentrated when pressure is applied to the diaphragm 9 can be offset relative to the joining interfaces of the first semiconductor substrate 3 and the second semiconductor substrate 4 through the first silicon oxide film 6.

Now, residual stresses arise in the joining interface of the first semiconductor substrate 3 and the second semiconductor substrate 4 through the first silicon oxide film 6 as a result of mismatching of crystal lattice constants of the first semiconductor substrate 3 and the second semiconductor substrate 4. In joining interfaces of this kind between the first semiconductor substrate 3 and the second semiconductor substrate 4, if large stresses are concentrated on the diaphragm 9 due application of pressure, cracking that arises in the second semiconductor substrate 4 may progress to the diaphragm 9 and lead to breakage of the diaphragm 9.

In the semiconductor pressure sensor 1C, because the region in which stresses are concentrated when pressure is applied to the diaphragm 9 is offset from the joining interfaces of the first semiconductor substrate 3 and the second semiconductor substrate 4 through the first silicon oxide film 6, cracking that arises in the second semiconductor substrate is prevented from progressing and damaging the diaphragm 9. In other words, breakage pressure tolerance of the diaphragm 9 can be improved.

A method for manufacturing the semiconductor pressure sensor 1C will now be explained.

Figure 11:
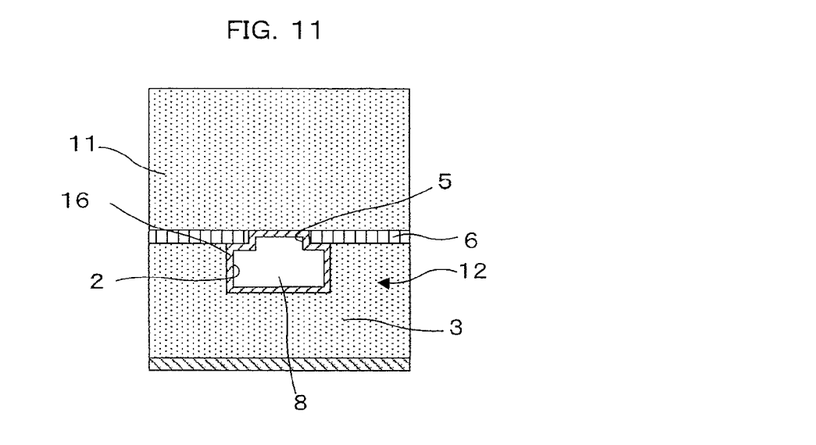
FIG. 11 is a diagram that explains a linked substrate oxidizing treatment step in a method for manufacturing the semiconductor pressure sensor according to Embodiment 3 of the present invention.
Figure 12:
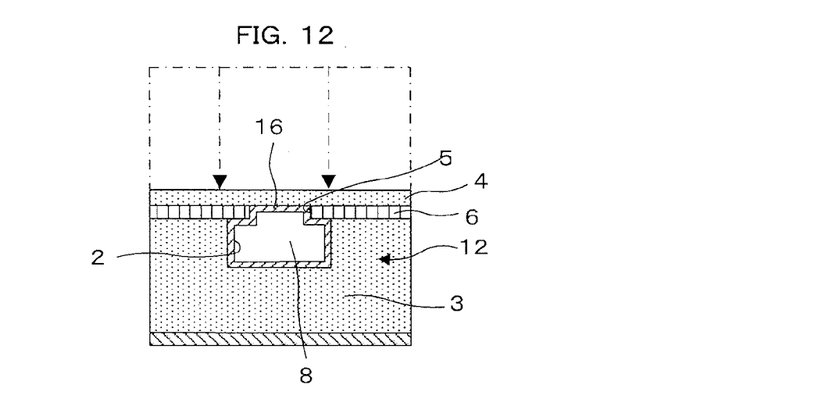
FIG. 12 is a diagram that explains a diaphragm forming step in the method for manufacturing the semiconductor pressure sensor according to Embodiment 3 of the present invention.
Figure 13:
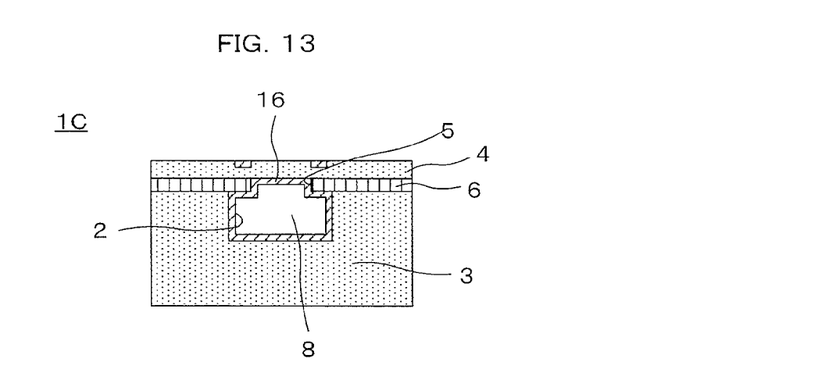
FIG. 13 is a diagram that explains a strain detecting element forming and aftertreatment step in the method for manufacturing the semiconductor pressure sensor according to Embodiment 3 of the present invention.

FIG. 11 is a diagram that explains a linked substrate oxidizing treatment step in a method for manufacturing the semiconductor pressure sensor according to Embodiment 3 of the present invention, FIG. 12 is a diagram that explains a diaphragm forming step in the method for manufacturing the semiconductor pressure sensor according to Embodiment 3 of the present invention, and FIG. 13 is a diagram that explains a strain detecting element forming and aftertreatment step in the method for manufacturing the semiconductor pressure sensor according to Embodiment 3 of the present invention.

Moreover, in FIGS. 11 through 13, portions identical to or corresponding to those in Embodiment 1 will be given identical numbering, and explanation thereof will be omitted.

A method for manufacturing the semiconductor pressure sensor 1C has a preparatory step, an insulating film and recess portion forming step, a substrate linking step, a linked substrate oxidizing treatment step, a diaphragm forming step, and a strain detecting element forming and aftertreatment step.

The preparatory step and the insulating film and recess portion forming step are similar to the preparatory step and the insulating film and recess portion forming step of the method for manufacturing the semiconductor pressure sensor 1A. In the substrate linking step, the semiconductor and insulating film substrate 12 is disposed in an environment that contains water vapor in advance to add moisture to the inner wall surface of the recess portion 2 before the semiconductor and insulating film substrate 12 and the second semiconductor base material substrate 11 are temporarily fixed.

In the linked substrate oxidizing treatment step that is subsequently performed, an annealing treatment is performed on the semiconductor and insulating film substrate 12 and the second semiconductor base material substrate 11 at high temperature, as shown in FIG. 11. Thus, the wall surfaces of the recess portion 2 and the penetrating aperture 5, and the wall surface of the second semiconductor substrate 4 that covers the opening of the penetrating aperture 5, are oxidized by the moisture contained in the inner wall surfaces of the recess portion 2 to form the third silicon oxide film 16, and the space that is configured inside the third silicon oxide film 16 constitutes the reference pressure chamber 8.

Thereafter, the semiconductor pressure sensor 1C can be obtained by implementing the diaphragm forming step and the strain detecting element forming and aftertreatment step in a similar manner to the method for manufacturing the semiconductor pressure sensor 1A, as shown in FIGS. 12 and 13.

Now, it is also conceivable for an oxide film that corresponds to the third silicon oxide film 16 to be preconfigured on the inner wall surfaces of the recess portion 2 of the semiconductor and insulating film substrate 12 and the penetrating aperture 5 before the substrate linking step. However, when an oxide film is preformed on the surfaces of the recess portion 2, warping may arise in the first semiconductor substrate 3 due to stresses that arise in the oxide film, or joining defects may arise between the first semiconductor substrate 3 and the second semiconductor substrate 4 as a result of stresses in the first semiconductor substrate 3 becoming non-uniform in the vicinity of the opening edge portions of the recess portion 2, etc.

When joining together a second semiconductor base material substrate 11 and a semiconductor and insulating film substrate 12 in which an oxide film has been formed in the recess portion 2 using an annealing treatment, growth rate of the oxide film differs between portions in a vicinity of an end portion of the semiconductor and insulating film substrate 12 near the recess portion 2, and portions of the second semiconductor base material substrate 11 that face those portions. As a result of this, the portions in the vicinity of the end portion near the recess portion 2 of the semiconductor and insulating film substrate 12 rise, and there is a risk that the second semiconductor base material substrate 11 may contact only these portions, without contacting other surfaces of the semiconductor and insulating film substrate 12, giving rise to joining defects between the semiconductor and insulating film substrate 12 and the second semiconductor base material substrate 11.

According to the method for manufacturing the semiconductor pressure sensor 1C, because the third silicon oxide film 16 is formed after first temporarily fixing the semiconductor and insulating film substrate 12 and the second semiconductor base material substrate 11, these problems can be avoided.

Embodiment 4

Figure 14:
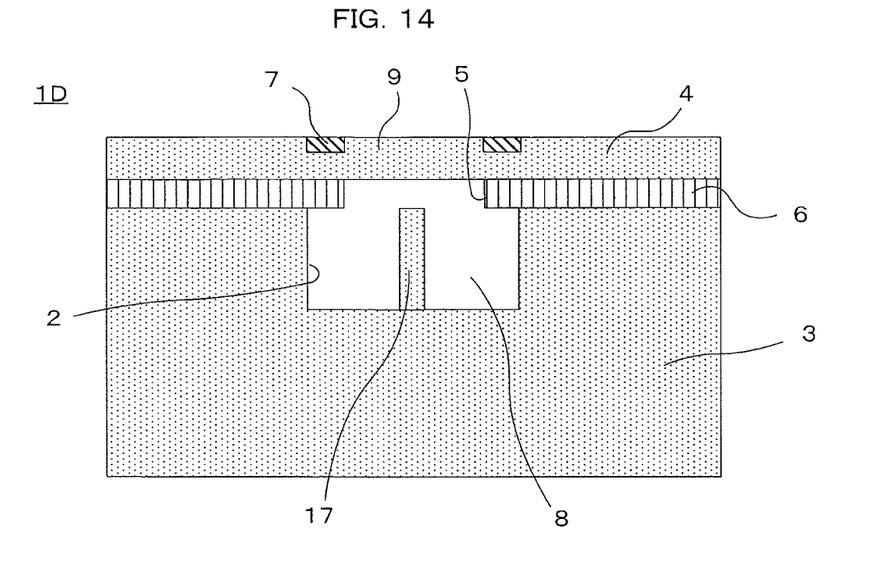
FIG. 14 is a cross section of a semiconductor pressure sensor according to Embodiment 4 of the present invention.

FIG. 14 is a cross section of a semiconductor pressure sensor according to Embodiment 4 of the present invention.

Moreover, in FIG. 14, portions identical to or corresponding to those in Embodiment 1 will be given identical numbering, and explanation thereof will be omitted.

In FIG. 14, a semiconductor pressure sensor 1D is configured in a similar manner to that of the semiconductor pressure sensor 1A except for having a stopper 17 that is formed integrally on a first semiconductor substrate 3, and that is disposed inside a reference pressure chamber 8.

The stopper 17 is disposed so as to project from a bottom portion of the recess portion 2 that faces a center of the diaphragm 9.

Here, a pressure range that the semiconductor pressure sensor 1D measures is P1 to P2.

When atmospheric pressure in the vicinity of the semiconductor pressure sensor 1D is P1, a predetermined gap is formed between a projecting end of the stopper 17 and the diaphragm 9, and when atmospheric pressure in the vicinity of the semiconductor pressure sensor 1D reaches P2 and the diaphragm 9 is flexed, the projecting end of the stopper 17 comes as close as possible to the diaphragm 9 without contacting the diaphragm 9.

According to a semiconductor pressure sensor 1D that has been configured in the above manner, the stopper 17 is placed in contact with the diaphragm 9 when the diaphragm 9 is made to flex by a predetermined amount by a predetermined pressure (the external force) greater than the maximum value P2 of the pressure range that is measured. Thus, even if an unexpected overpressure is applied to the diaphragm 9 from outside, the diaphragm 9 can be prevented as much as possible from being damaged because the diaphragm 9 is restricted by the stopper 17 from flexing by more than a predetermined amount.

Next, a method for manufacturing the semiconductor pressure sensor 1D will be explained.

Figure 15:
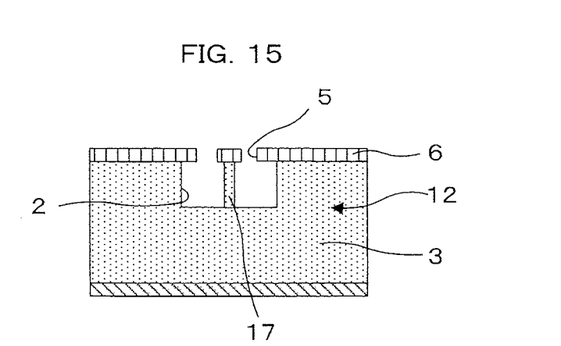
FIG. 15 is a diagram that explains an insulating film and recess portion forming step in a method for manufacturing the semiconductor pressure sensor according to Embodiment 4 of the present invention.
Figure 16:
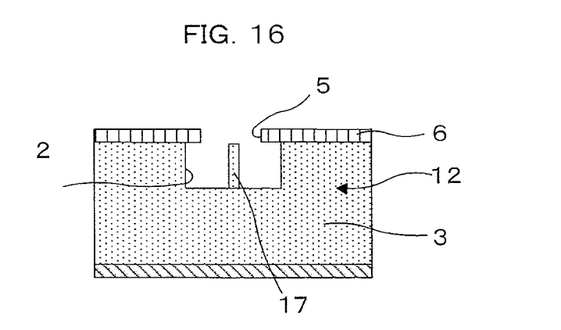
FIG. 16 is a diagram that explains an oxide film selective removal step in the method for manufacturing the semiconductor pressure sensor according to Embodiment 4 of the present invention.
Figure 17:
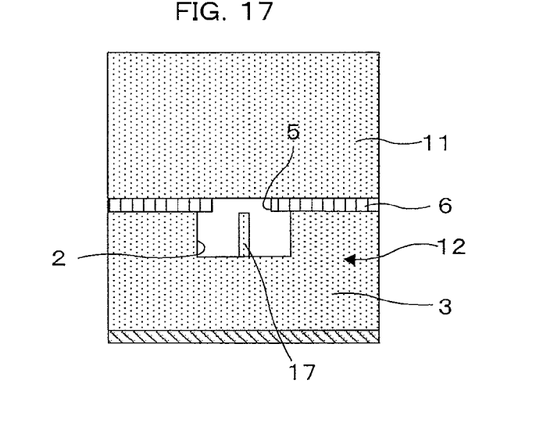
FIG. 17 is a diagram that explains a substrate linking step in the method for manufacturing the semiconductor pressure sensor according to Embodiment 4 of the present invention.
Figure 18:
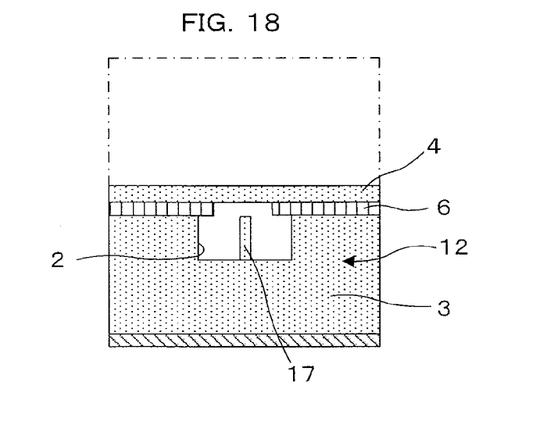
FIG. 18 is a diagram that explains a diaphragm forming step in the method for manufacturing the semiconductor pressure sensor according to Embodiment 4 of the present invention.
Figure 19:
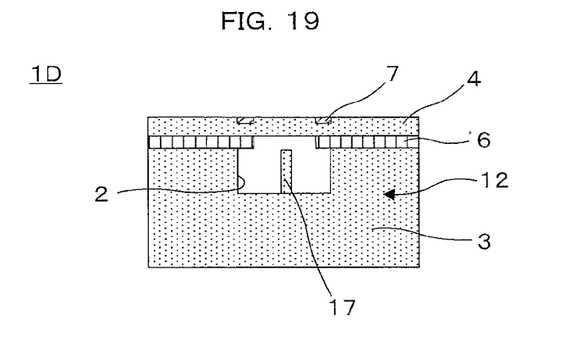
FIG. 19 is a diagram that explains a strain detecting element forming and aftertreatment step in the method for manufacturing the semiconductor pressure sensor according to Embodiment 4 of the present invention.

FIG. 15 is a diagram that explains an insulating film and recess portion forming step in a method for manufacturing the semiconductor pressure sensor according to Embodiment 4 of the present invention, FIG. 16 is a diagram that explains an oxide film selective removal step in the method for manufacturing the semiconductor pressure sensor according to Embodiment 4 of the present invention, FIG. 17 is a diagram that explains a substrate linking step in the method for manufacturing the semiconductor pressure sensor according to Embodiment 4 of the present invention, FIG. 18 is a diagram that explains a diaphragm forming step in the method for manufacturing the semiconductor pressure sensor according to Embodiment 4 of the present invention, and FIG. 19 is a diagram that explains a strain detecting element forming and aftertreatment step in the method for manufacturing the semiconductor pressure sensor according to Embodiment 4 of the present invention.

Moreover, in FIGS. 15 through 19, portions identical to or corresponding to those in Embodiment 1 will be given identical numbering, and explanation thereof will be omitted.

A method for manufacturing the semiconductor pressure sensor 1D has a preparatory step, an insulating film and recess portion forming step, a substrate linking step, a diaphragm forming step, and a strain detecting element forming and aftertreatment step.

The preparatory step is similar to the preparatory step of the method for manufacturing the semiconductor pressure sensor 1A.

In the insulating film and recess portion forming step, the penetrating aperture 5 is formed in the first silicon oxide film 6 by a technique that is similar to that of the semiconductor pressure sensor 1A, but as shown in FIG. 15, a predetermined portion of the first silicon oxide film 6 that is positioned centrally on the region of formation of the penetrating aperture 5 is left insularly. Next, the recess portion 2 is formed by applying etching to the first semiconductor substrate 3 through the penetrating aperture 5. A stopper 17 that is disposed so as to project from the bottom portion of the recess portion 2, and that has a portion of the third silicon oxide film 16 on a projecting end, is thereby formed inside the recess portion 2.

In the oxide film selective removal step, only the portion of the third silicon oxide film 16 that is formed on the projecting end of the stopper 17 is selectively removed by dry etching, etc., as shown in FIG. 16. Moreover, the portion of the third silicon oxide film 16 that is formed on the projecting end of the stopper may also be selectively removed using a method such as ion milling, etc.

Here, not only the third silicon oxide film 16, but also a predetermined region of the stopper 17 from the projecting end toward a base end is removed. A projecting end surface of the stopper 17 is left as a rough surface.

In the substrate linking step that is subsequently performed, the semiconductor and insulating film substrate 12 and the second semiconductor base material substrate 11 are temporarily fixed such that the second semiconductor base material substrate 11 covers the penetrating aperture 5, and faces the first semiconductor substrate 3 so as to have the first silicon oxide film 6 interposed in a similar manner to the substrate linking step of the method for manufacturing the semiconductor pressure sensor 1A, as shown in FIG. 17. Here, a predetermined gap is formed between a projecting end of the stopper 17 and the second semiconductor base material substrate 11.

Thereafter, manufacturing of the semiconductor pressure sensor 1D is completed by implementing the diaphragm forming step and the strain detecting element forming and aftertreatment step in a similar manner to the method for manufacturing the semiconductor pressure sensor 1A, as shown in FIGS. 18 and 19.

According to the above method for manufacturing the semiconductor pressure sensor 1D, the diaphragm 9 is formed in the diaphragm forming step by reducing the thickness of the second semiconductor base material substrate 11 by grinding or chemical machine polishing, as has been described above.

If the reference pressure chamber 8 is a vacuum, for example, the diaphragm forming region of the second semiconductor base material substrate 11 flexes as the second semiconductor base material substrate 11 is reduced in thickness. If the formed diaphragm 9 is to be used to detect minute pressures, it is necessary for the thickness of the diaphragm 9 to be made particularly thin. Because of this, if the stopper 17 is not disposed, the diaphragm forming region of the second semiconductor base material substrate 11 may flex significantly when the thickness of the second semiconductor base material substrate 11 approaches the desired thickness of the diaphragm 9, depending on the load during grinding. Thus, the thickness of the formed diaphragm 9 may vary significantly. If unexpected excessive pressure is applied to the diaphragm 9, there is a risk that the diaphragm 9 may flex significantly and break if displacement of the diaphragm 9 is not restricted.

By predisposing the stopper 17 before the diaphragm forming step, on the other hand, as in the method for manufacturing the semiconductor pressure sensor 1D, even if the diaphragm forming region of the second semiconductor base material substrate 11 begins to flex significantly during the grinding of the second semiconductor base material substrate 11, it will come into contact with the stopper 17 and be prevented from flexing significantly. Irregularities in the thickness of the diaphragm 9 that is being formed can thereby be suppressed. In addition, even if excessive pressure is applied to the diaphragm 9, the diaphragm 9 can be prevented from being damaged because flexing of the diaphragm 9 is suppressed.

By leaving the projecting end surface of the stopper 17 as a rough surface, if the diaphragm 9 comes into contact with the stopper 17 after completion of the semiconductor pressure sensor 1D, the stopper 17 and the diaphragm 9 can be prevented from adhering to each other and being unable to separate.

Moreover, according to Embodiment 4, the number of stoppers 17 formed is explained as being one, but the number of stoppers 17 formed is not limited to one, and by setting the number of stoppers 17 formed and the positions of disposition of the stoppers 17 inside the reference pressure chamber 8 appropriately depending on the size or thickness of the diaphragm 9, it may also be possible to suppress irregularities in the thickness of the diaphragm 9 in the diaphragm forming step, or improve breakage pressure tolerance, etc.

Embodiment 5

Figure 20:
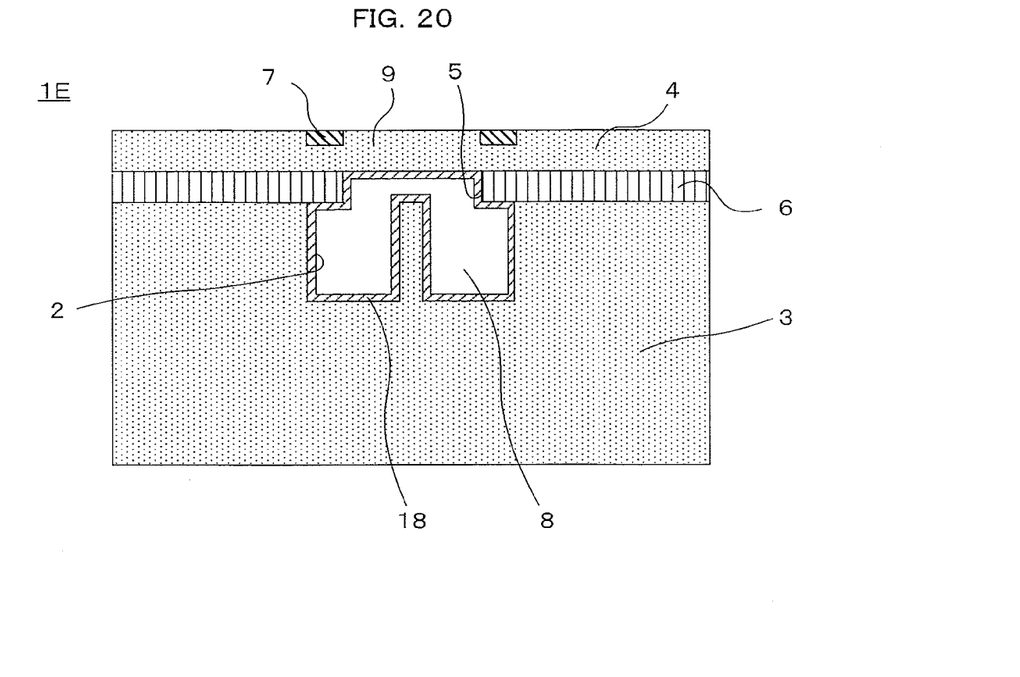
FIG. 20 is a cross section of a semiconductor pressure sensor according to Embodiment 5 of the present invention.

FIG. 20 is a cross section of a semiconductor pressure sensor according to Embodiment 5 of the present invention.

Moreover, in FIG. 20, portions identical to or corresponding to those in Embodiment 3 will be given identical numbering, and explanation thereof will be omitted.

In FIG. 20, a semiconductor pressure sensor 1E includes a fourth silicon oxide film 18 that functions as a third insulating film on all parts of surfaces of a reference pressure chamber 8 that include surfaces of a stopper 17. The rest of the configuration is similar to the configuration of the semiconductor pressure sensor 1C.

Moreover, a method for manufacturing the semiconductor pressure sensor 1E is configured by adding a step that is similar to the linked substrate oxidizing treatment step in the method for manufacturing the semiconductor pressure sensor 1C to the method for manufacturing the semiconductor pressure sensor 1D between the substrate linking step and the diaphragm forming step.

According to a semiconductor pressure sensor 1E that has been configured in the above manner, a gap between the tip of the stopper 17 and the diaphragm 9 which have been covered by the fourth silicon oxide film 18 can be made smaller than the thickness of the first silicon oxide film 6.

Now, when the semiconductor pressure sensor 1E is placed in an environment in which the maximum value P2 of the pressure range that is being measured is applied, and the diaphragm 9 flexes, the diaphragm 9 often does not project beyond the penetrating aperture 5 toward the bottom portion of the recess portion 2.

By inserting the projecting end of the stopper 17 inside the penetrating aperture 5 so as not to contact the diaphragm 9 even if the semiconductor pressure sensor 1E is placed in an environment in which the maximum value P2 of the pressure range is applied, and the diaphragm 9 flexes, the following effects can be achieved.

Specifically, because flexing of the diaphragm forming region when grinding the second semiconductor base material substrate 11 in the diaphragm forming step can be suppressed, irregularities in the thickness of the diaphragm 9 can be reduced further. Because the diaphragm 9 can be further prevented from flexing significantly if the diaphragm 9 is pressed and flexed by excessive pressure from outside, breakage pressure tolerance can be further improved.

Embodiment 6

Figure 21:
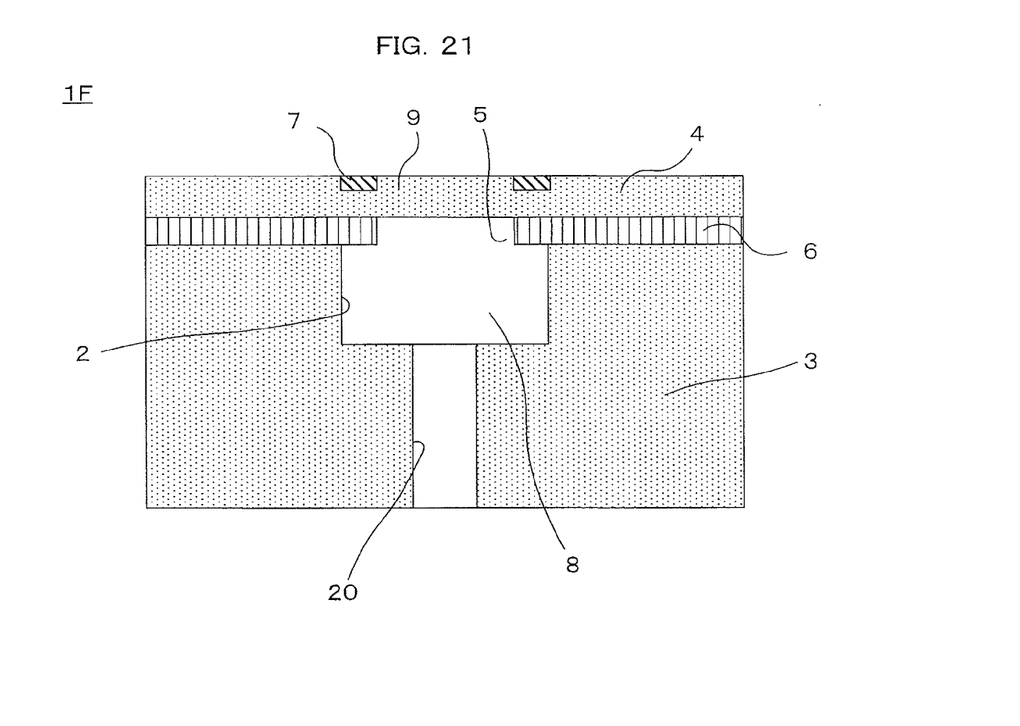
FIG. 21 is a cross section of a semiconductor pressure sensor according to Embodiment 6 of the present invention.

FIG. 21 is a cross section of a semiconductor pressure sensor according to Embodiment 6 of the present invention.

Moreover, in FIG. 21, portions identical to or corresponding to those in Embodiment 1 will be given identical numbering, and explanation thereof will be omitted.

In FIG. 21, a communicating aperture 20 that communicates between a bottom portion of a recess portion 2 and a second surface of a first semiconductor substrate 3 is formed on a semiconductor pressure sensor 1F. The rest of the configuration is similar to the configuration of the semiconductor pressure sensor 1A.

Next, a method for manufacturing the semiconductor pressure sensor 1F will be explained.

The method for manufacturing the semiconductor pressure sensor 1F is similar to the method for manufacturing the first semiconductor pressure sensor 1A except that a communicating aperture forming step is added after the insulating film and recess portion forming step.

In the communicating aperture forming step, the first silicon oxide film 6 on the second surface side of the semiconductor and insulating film substrate 12 is removed using a photoengraving technique and a plasma etching technique, and the communicating aperture 20 that communicates between the bottom portion of the recess portion 2 and the second surface of the first semiconductor substrate 3 is formed using a Bosch process in a similar manner to the formation method for the recess portion in the insulating film and recess portion forming step. By forming the communicating aperture 20 using a Bosch process, the opening of the communicating aperture 20 can be made small, because the first semiconductor substrate 3 can be etched such that an aperture direction of the communicating aperture 20 is oriented in a thickness direction of the first semiconductor substrate 3, ensuring a region for fixing the second surface of the first semiconductor substrate 3 to a casing, etc., using a die-bond material, for example.

A semiconductor pressure sensor 1F that has been configured as described above is a differential pressure sensor that measures a difference between pressure on a side near the first semiconductor substrate 3 and pressure on a side near the second semiconductor substrate 4. In other words, where there are two partitioned spaces, for example, the semiconductor pressure sensor 1F can be used as a differential pressure sensor that can measure the pressure difference between the partitioned spaces by disposing the diaphragm 9 so as to be exposed to one space, and disposing the opening of the communicating aperture 20 so as to be exposed to the other space.

Embodiment 7

Figure 22:
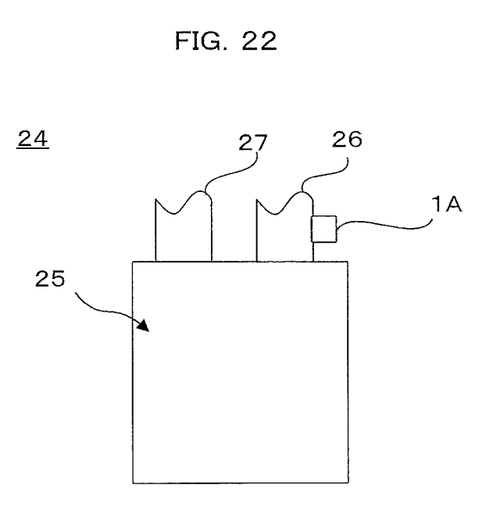
FIG. 22 is a block structural diagram of an internal combustion engine apparatus with a semiconductor pressure sensor according to Embodiment 7 of the present invention.

FIG. 22 is a structural diagram of an internal combustion engine apparatus with a semiconductor pressure sensor according to Embodiment 7 of the present invention.

In FIG. 22, an internal combustion engine apparatus 24 with a semiconductor pressure sensor has: an internal combustion engine 25 that has an air intake passage 26 and an exhaust pathway 27; and a semiconductor pressure sensor 1A that is mounted to the internal combustion engine 25 so as to enable measurement of pressure in the air intake passage 26 of the internal combustion engine 25. Specifically, a surface of a diaphragm 9 of the semiconductor pressure sensor 1A is disposed inside the air intake passage 26.

In the internal combustion engine 25, the measured range of pressures in the air intake passage 26 is usually approximately five atmospheres at most, but if a backfire occurs, the pressure inside the air intake passage 26 may increase abnormally.

Because of this, the diaphragm 9 requires a breakage pressure tolerance that is greater than or equal to five to ten times the measured range of pressures in the air intake passage 26.

The breakage pressure tolerance of the diaphragm 9 in the semiconductor pressure sensor 1A is improved, and can be used for pressure measurement inside the air intake passage 26 of the internal combustion engine 25 simply by increasing the thickness of the diaphragm 9 by a certain amount.

Moreover, in Embodiment 7, a semiconductor pressure sensor 1A is explained as being mounted to the internal combustion engine 25 to constitute the internal combustion engine apparatus 24 with the semiconductor pressure sensor, but any of the semiconductor pressure sensors 1B through 1F may also be mounted instead of the semiconductor pressure sensor 1A.

What is claimed is:
1. A semiconductor pressure sensor comprising:
a first semiconductor substrate on which is formed a recess portion that has an opening on a first surface in a thickness direction;
a second semiconductor substrate that is disposed so as to face said first surface of said first semiconductor substrate; and
a first insulating film that is interposed between said first semiconductor substrate and said second semiconductor substrate, and on which is formed a penetrating aperture that communicates between said recess portion and said second semiconductor substrate, wherein:
an airtight reference pressure chamber is formed from said first semiconductor substrate, said second semiconductor substrate and said first insulating film, and
at least a portion of an edge portion of said penetrating aperture is positioned inside an opening edge portion of said recess portion when viewed from a side facing said penetrating aperture and said opening of said recess portion.

2. A semiconductor pressure sensor according to claim 1, wherein all parts of said edge portion of said penetrating aperture are positioned further inward than said opening edge portion of said recess portion.

3. A semiconductor pressure sensor according to claim 2, wherein all parts of said edge portion of said penetrating aperture are at positions that are separated by a predetermined distance X from said opening edge portion of said recess portion, and satisfy $0<X/T\le50$, where T is a thickness of said first insulating film.

4. A semiconductor pressure sensor according to claim 1, further comprising a second insulating film,
said second insulating film covers said opening of said penetrating aperture by being arranged between said second semiconductor substrate and said first insulating film.

5. A semiconductor pressure sensor according to claim 1, further comprising a third insulating film,
said third insulating film is formed on all parts of wall surfaces that constitute said recess portion and said penetrating aperture, and a wall surface of said second semiconductor substrate that covers said opening of said penetrating aperture.

6. A semiconductor pressure sensor according to claim 1, further comprising a stopper,
said stopper restricts flexing of said second semiconductor substrate by coming into contact with said second semiconductor substrate when an external force is applied that flexes a portion of said second semiconductor substrate that faces said recess portion by a predetermined amount or greater toward said recess portion is disposed inside a space that is surrounded by wall surfaces that constitute said recess portion and said penetrating aperture and a wall surface of said second semiconductor substrate that covers said opening of said penetrating aperture.

7. A semiconductor pressure sensor according to claim 1, further comprising a communicating aperture being formed on said first semiconductor substrate,
said communicating aperture communicates between said recess portion and a second surface of said first semiconductor substrate.

8. A semiconductor pressure sensor according to claim 1, wherein said second semiconductor substrate has a surface that is configured on a portion that faces said recess portion so as to enable detection of a pressure value that corresponds to pressure that is applied from an opposite side from said recess portion, and said surface to which said pressure is applied is disposed inside an air intake passage of an internal combustion engine.

* * * * *